(12) United States Patent
Fjelstad (10) Patent No.: US 8,067,777 B2
(45) Date of Patent: Nov. 29, 2011

(54) LIGHT EMITTING DIODE PACKAGE ASSEMBLY

(75) Inventor: Joseph C. Fjelstad, Maple Valley, WA (US)

(73) Assignee: Occam Portfolio LLC, Cupertino, CA (US)

( * ) Notice: Subject to any disclaimer, the term of this patent is extended or adjusted under 35 U.S.C. 154(b) by 19 days.

(21) Appl. No.: 12/190,464

(22) Filed: Aug. 12, 2008

(65) Prior Publication Data

US 2009/0278139 A1 Nov. 12, 2009

Related U.S. Application Data

(60) Provisional application No. 61/052,592, filed on May 12, 2008.

(51) Int. Cl.
*H01L 29/18* (2006.01)
(52) U.S. Cl. ..... 257/88; 257/91; 257/100; 257/E33.056; 313/500; 438/28
(58) Field of Classification Search ..... 438/23, 438/28, 29, 107, 121, 26; 257/99, 100, E33.056, 257/E33.057, E33.058, E33.059, E25.028, 257/88, 91; 313/499, 500
See application file for complete search history.

(56) References Cited

U.S. PATENT DOCUMENTS

| | | | |
|---|---|---|---|
| 6,531,328 B1 * | 3/2003 | Chen | 438/26 |
| 6,930,332 B2 | 8/2005 | Hashimoto et al. | |
| 7,038,195 B2 * | 5/2006 | Kida et al. | 250/239 |
| 7,308,195 B2 * | 12/2007 | Yumiki et al. | 396/75 |
| 7,352,127 B2 | 4/2008 | Jeganathan et al. | |
| 2005/0280019 A1 * | 12/2005 | Konno | 257/100 |
| 2007/0263408 A1 * | 11/2007 | Chua | 362/612 |
| 2008/0265272 A1 * | 10/2008 | Oh et al. | 257/99 |
| 2009/0146158 A1 * | 6/2009 | Park | 257/89 |

FOREIGN PATENT DOCUMENTS

| | | |
|---|---|---|
| JP | 2006-344690 A | 12/2006 |
| WO | 2004/068596 A1 | 8/2004 |
| WO | WO 2004/068596 A1 * | 8/2004 |

OTHER PUBLICATIONS

PCT/US2008/072990, International Search Report and Written Opinion dated Mar. 11, 2009.

* cited by examiner

*Primary Examiner* — Julio J Maldonado
(74) *Attorney, Agent, or Firm* — Edward P. Heller, III (57) ABSTRACT

An electrical device containing multiple light emitting diode (LED) dies each having respective first and second connectors suitable to receive current through the LED die. A common base layer of a first electrically conductive material has cavities into which at least one LED die is mounted with its second connector electrically connected by a conductive bonding material to the first conductive material of the base layer. One or more over-layer sections of a second electrically conductive material each are electrically connected by a bond to at least one of the first connector of an LED die. And an insulator electrically separates the first conductive material of the base layer from the second conductive material of over-layer sections.

10 Claims, 7 Drawing Sheets

LIGHT EMITTING DIODE PACKAGE ASSEMBLY

CROSS-REFERENCE TO RELATED APPLICATIONS

This application claims the benefit of U.S. Provisional Application No. 61/052,592, filed May 12, 2008, hereby incorporated by reference in its entirety.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC

Not applicable.

COPYRIGHT NOTICE AND PERMISSION

This document contains some material which is subject to copyright protection. The copyright owner has no objection to the reproduction with proper attribution of authorship and ownership and without alteration by anyone of this material as it appears in the files or records of the Patent and Trademark Office, but otherwise reserves all rights whatsoever.

BACKGROUND OF THE INVENTION

1. Technical Field

The present invention relates generally to light emitting diode (LED) arrays and the assembly thereof, and more particularly, but not exclusively, to such created in a custom fashion using primarily mechanical processes.

2. Background Art

A light emitting diode (LED) is essentially a PN junction semiconductor diode that emits light when current is applied across positive and negative leads, terminals, or connectors. By definition, the LED is a solid-state device that passes current without a heated filament, and thus is inherently more reliable. The materials used in the manufacture of the LED determine the color of the light produced. A clear epoxy resin is commonly used to encapsulate the LED or an assembly of LEDs to protect the dies and the electrical interconnections to them, and to allow light to pass out of the assembly.

The LED is highly efficient (~90% efficient) for the conversion of electrons into photons. For comparison, incandescent lighting is roughly only 10% efficient, with 90% of the provided energy being converted to heat, and fluorescent lighting is only approximately 50% efficient. Having such high efficiency, technologies based on the LED are viewed as promising to help meet our future energy reduction goals.

In the operation of a LED the luminous intensity is roughly proportional to the amount of current that is supplied, and the higher the current the greater will be the light intensity produced, subject to the design limits of the device and the materials used. The amount of light emitted from an LED is quantified by a single point, on-axis luminous intensity value (Iv) and LED intensity is specified in terms of millicandela (mcd). In contrast, the light produced by incandescent lamps is usually quantified with a value for mean spherical candlepower (MSCP). These values for LEDs and incandescent lamps are not comparable.

In general, individual LED chips or dies are designed to operate around 20 milliamps (mA). Care must be exercised, however, as the operating current often must be limited relative to the amount of heat in the application. For example, a multiple-chip-in-a-package LED device incorporating multiple wire bonds and junction points will obviously produce more heat and thus be more affected by thermal stress than will a single-chip-in-a-package LED device. Similarly, LEDs designed to operate at higher voltages are subject to greater heat. Important design objectives for LEDs therefore usually include providing for long-life operation at optimum design currents and providing adequate heat dissipation as a defense against thermal degradation.

Presently, solders and soldering processes are commonly used to make the interconnections between a LED device and its sources of power and ground. The use of solders and higher temperature soldering processes, however, are rife with problems. These materials and processes have always had certain disadvantages, and a number of new trends in the electronics industry as well as newly emerging applications for LEDs are revealing or exacerbating other disadvantages, especially for arrays and other assemblies containing many LEDs.

One set of such disadvantages relates to solder materials. Tin/lead type solders (e.g., Sn63/Pb37) have been widely used since the earliest days of the electronics industry. Unfortunately, both tin and especially lead have serious chemical disadvantages. For these two metals, mining the ores, refining those ores, working with the refined metals during manufacturing, being exposed to substances including these in manufactured products, and disposing of the products at the end of their life cycles are all potentially damaging to human and animal health and to the environment.

Recently human health and environmental concerns about tin/lead type solders have resulted in the Directive on the Restriction of the Use of Certain Hazardous Substances in Electrical and Electronic Equipment (commonly referred to as the Restriction of Hazardous Substances Directive or RoHS) in the European Union. This directive restricts the use of six hazardous materials, including lead, in the manufacture of various types of electronic and electrical equipment. This directive is also closely linked with the Waste Electrical and Electronic Equipment Directive (WEEE) 2002/96/EC, which sets collection, recycling, and recovery targets for electrical goods. Together these directives are part of a growing worldwide legislative initiative to solve the problem of electronic device waste.

To some extent the electronics industry has always been searching for a practical substitute for tin/lead type solders, and legislative initiatives like those just noted are now motivating a number of changes. Today a common substitute for tin/lead type solders are SAC type solder varieties, which are alloys containing tin (Sn), silver (Ag), and copper (Cu). But this is merely a compromise. Mining, refining, working during manufacturing, exposure from manufactured products, and disposal are still all issues for tin, silver, and copper. Furthermore, SAC solder processes are prone to other problems, such as the formation of shorts (e.g., "tin whiskers") and opens if surfaces are not properly prepared. It follows that the undue use of some materials, like those in solders, are generally undesirable in electronic assemblies, including LED assemblies.

Another set of disadvantages in the solder-based assembly of electronic products is the high temperature processes that are inherently required. The use of heat on and around many electronic components has always been undesirable. As a general principle, the heating of electronic components increases their failure rate in later use and beyond a certain point outright destroys such components. Tin/lead solders melt at moderate temperatures relative to the thermal limits of traditional materials used in electronics manufacture, and their use has generally been tolerable for many components. This is not always the same for SAC type solders, which melt at much higher temperatures (e.g., ~40° C. or hotter). When SAC type solders are used the likelihood of component damage is much higher, resulting in assemblies that fail during post-manufacturing testing as well as in-the-field failures. Additionally, generating and managing the heat during manufacturing have increased energy, safety, and other costs. It therefore follows that the undue use of heat-based manufacturing processes, like soldering, is also generally undesirable in electronic assemblies.

Increasingly yet another set of disadvantages in the solder-based assembly of electronic products is one related to the "adding" of materials. When a material, like solder, is added between two components to hold them together the additional material inherently has to occupy some space. Solders contain higher density metals, thus increasing the ultimate weight of electronic products. The use of liquid-state materials, like liquid stage solder during manufacturing, often requires designing in additional space around leads, terminals, and connection pads to account for the ability of the liquid to flow easily and to potentially short to other leads, terminals, pads, etc. Liquid solders have high surface tensions and effects from this also usually require major design consideration. These are all factors that can require consideration as designers increasingly strive to miniaturize electronic assemblies. Accordingly, it further follows that the undue use of any additional material in manufactured assemblies and in manufacturing processes, again like solder, is generally undesirable in the resulting electronic assemblies.

In addition to the noted disadvantages in the solder-based assembly of electronic products, generally, there can be additional problems in particular in the solder-based assembly of LEDs. For example, in an LED the soldering process can be difficult because the ideal substrates for thermal degradation protection are typically good thermal conductors, purposefully being used because they have a high thermal capacity that will help keep the LED assembly within its desired temperature range during operation. This creates a significant challenge for solder assembly of LED packages, however, because the package must be raised to an even more elevated temperature to create reliable solder joints and the necessary temperatures can then degrade or damage the encapsulant used in the manufacture of the LED package. Moreover, exposure to certain cleaning chemicals may attack the LED surface and cause discoloration.

Figure 1:
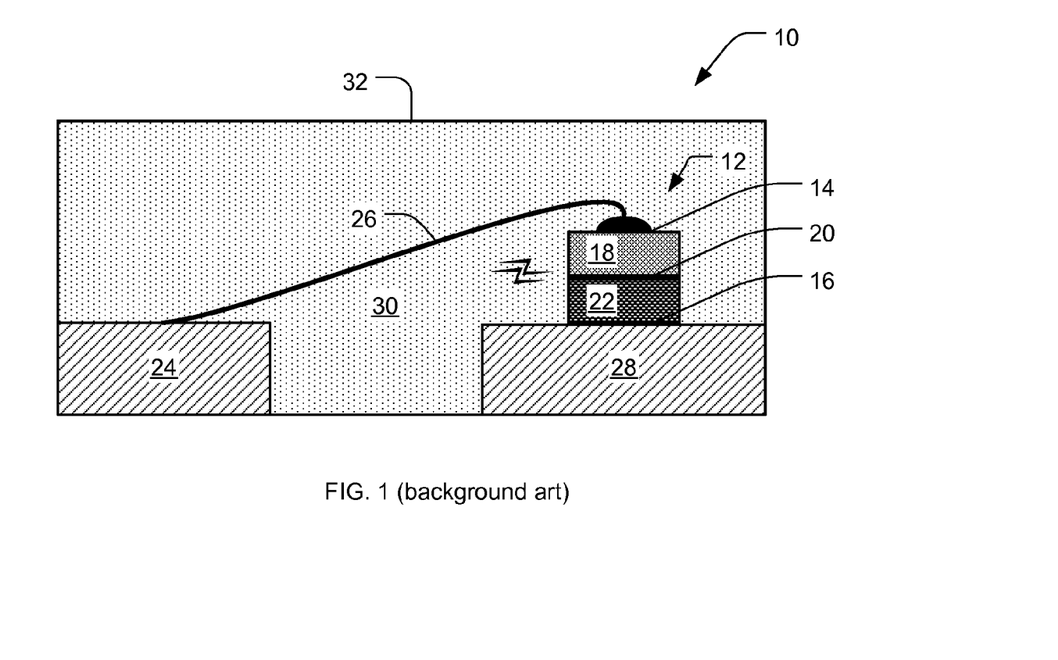
FIG. 1 (background art) is a cross-section side view of a typical LED package which may be used in conventional LED assemblies.
Figure 2:
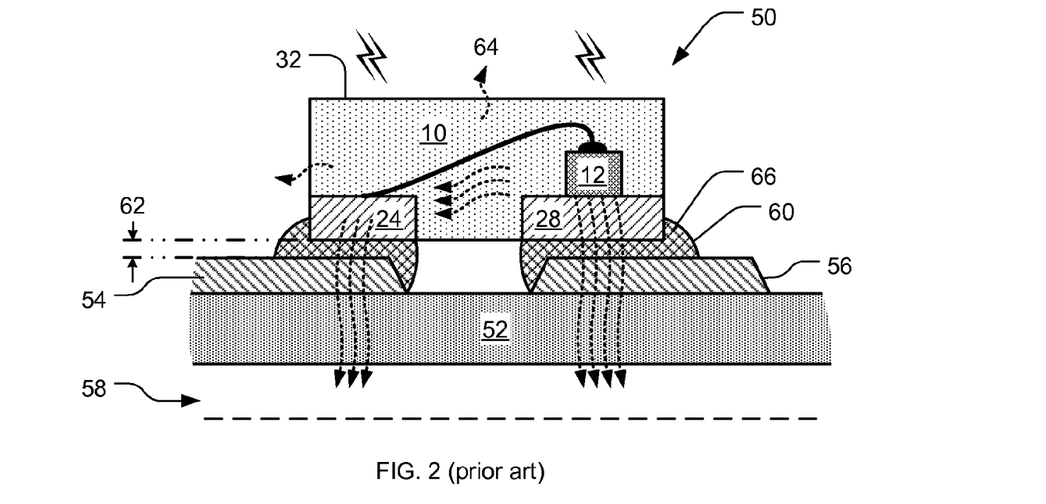
FIG. 2 (prior art) is a cross-section side view of a conventional LED assembly that includes the LED package of FIG. 1.

FIGS. 1-2 will help to illustrate some of the above points, as well as help to introduce some additional points.

FIG. 1 (background art) is a cross-section side view of a typical LED package 10 which may be used in conventional LED assemblies. The LED package 10 includes a conventional LED die 12 that has a first connector 14, a second connector 16, a P-layer 18, a P-N junction 20, and an N-layer 22. The first connector 14 here is electrically connected to a first terminal 24 with a conductive lead 26 and the second connector 16 is directly electrically connected to a second terminal 28.

A body 30 is further provided that fills multiple roles. For example, the body 30 physically holds the other elements of the LED package 10 in fixed relationships. This serves to protect the internal elements of the LED package 10 (i.e., the LED die 12 and the conductive lead 26), to place and retain the externally communicating elements of the LED package 10 where needed, and generally to facilitate handling of the LED package 10 when mounting it into an electronic assembly or a larger LED assembly. The body 30 also serves to optically pass the light wavelengths that the LED die 12 emits. For this the body 30 particularly has a face 32 where light from the LED die 12 is primarily emitted from the LED package 10. The body 30 may also serve to conduct heat away from internal elements of the LED package 10. Historically this thermally conductive role has usually not been an important one, but that is now changing, especially for emerging high power LED applications. In view of all of these roles, the body 30 of the LED package 10 is typically of a single plastic material, with glass, quartz, or hybrids of materials sometimes also being used.

FIG. 2 (prior art) is a cross-section side view of a conventional LED assembly 50 that includes the LED package 10 of FIG. 1. The LED assembly 50 here is oriented as it is typically manufactured and as it is often used, that is, with the light emitting face 32 of the LED package 10 oriented upward.

In this orientation the LED assembly 50 is now discussed as generally being "built" from the bottom up. An electrically insulating substrate 52 is usually provided, if for no other reason than to physically support an anode trace 54 and a cathode trace 56 as shown. However, optional elements may also be provided in a sub-region 58 below the substrate 52. For example, if the substrate 52 is the top most non-conductive layer of a printed circuit board (PCB), other layers may also be present in this sub-region 58 (e.g., a ground plane or "reverse side" feature if the printed circuit board is double sided).

For some emerging applications a feature that may particularly be present in the sub-region 58 below the substrate 52 is a heat spreader. The substrate 52 will typically serve to some extent to transfer heat, but it may not be optimal for that. To clarify, the role of a heat sink (which many in the art are more familiar with) and that of a heat spreader are different. Although these elements operate similarly to some extent, a head sink is optimized to remove thermal energy from a particular location, typically a point or small location, whereas a head spreader is optimized to distribute and equalize thermal energy across an area or large location.

Continuing with FIG. 2, the anode trace 54 and the cathode trace 56 are located above the substrate 52. Again, the common PCB serves as a useful example here. In a PCB the substrate 52 is usually an electrical insulating material, the traces 54, 56 are copper foil, and the necessary pattern of the traces 54, 56 on the substrate 52 is achieved with silkscreen printing, photolithography, milling, or some other suitable process.

Of particular interest here is the next higher feature in the LED assembly 50, a set of solder pads 60. These electrically connect the anode trace 54 to the first terminal 24 and the cathode trace 56 to the second terminal 28 of the LED package 10. The solder pads 60 also physically connect the LED package 10 to the rest of the LED assembly 50, thus holding the LED package 10 in place.

The possible materials in the solder pads 60 have already been discussed elsewhere herein and are legend. It should further be observed here, however, that the solder pads 60 inherently add an additional level or displacement layer 62 to the overall LED assembly 50. In applications where the overall thickness of the LED assembly 50 is critical, this displacement layer 62 can be a concern and minimizing or eliminating it can then be an important goal.

FIG. 2 also stylistically shows thermal flow paths 64 out of the LED package 10 and into the LED assembly 50. As can be seen here, much of the thermal energy produced by the LED package 10 passes through the solder pads 60, with the majority of it flowing through the second terminal 28 and the cathode trace 56. In some applications this thermal flow can cause serious problems. For instance, if too much heat builds up in the LED package 10 it may be damaged internally. The solder pads 60 tend to be thermally conductive, but they nonetheless lengthen and complicate the primary paths that thermal energy must travel to exit the LED package 10. Furthermore, since the flow of thermal energy in the structures of the LED package 10 and in the overall LED assembly 50 are not instantaneous, localized heating can result (e.g., in the region at the second terminal 28 of the LED package 10 in FIG. 2). This can thermally stress the LED die 12, the LED package 10, and the LED assembly 50. In extreme situations this can cause separation of a solder pad 60 from the first terminal 24, the second terminal 28, or from a trace 54, 56 and such stress can even result in a fracture of the body 30 of the LED package 10.

In FIG. 2 the thermal flow paths 64 out the top and sides of the LED package 10 are minimal (as stylistically depicted with lesser weight arrows). There is little that can be done with respect to the top of the LED package 10, since the face 32 here needs to emit the light produced. But the sides of the LED package 10 would appear to be another matter. Unfortunately however, the solder pads 60 tend to interfere with what can be done here. Having the sides of the LED package 10 open (as shown in FIG. 2) is desirable when the LED package 10 is soldered into the LED assembly 50, especially in surface mount device (SMD) embodiments of the LED assembly 50 where surface tension effects of the liquid solder are relied on to help position the LED package 10. But after soldering, wick regions 66 in the solder pads 60 (also caused by surface tension effects when the solder is liquid) usually remain and can interfere with adding a thermal conductor to the sides of the LED package 10 once it is in the LED assembly 50.

In summary, the use of solder materials, the use of heat-based soldering manufacturing processes, the undue addition of solder material to manufactured assemblies and these and additional problems particular to the solder-based assembly of LEDs are all generally undesirable.

BRIEF SUMMARY OF THE INVENTION

Accordingly, it is an object of the present invention to provide improved light emitting diode (LED) package assemblies.

Briefly, one preferred embodiment of the present invention is an electrical device. A multitude of light emitting diode (LED) dies are provided, each having respective first and second connectors that are suitable for receiving electrical current through the LED die. A common base layer is provided of a first electrically conductive material. The base layer has multiple cavities into which at least one of the LED dies is mounted such that its second connector is electrically connected by a conductive bonding material to the first conductive material of the base layer. At least one over-layer section of a second electrically conductive material is provided, wherein each over-layer is electrically connected by a bond to at least one of the first connectors of an LED die. And an insulator is provided that electrically separates the first conductive material of the base layer from the second conductive material of the at least one over-layer section.

Briefly, another preferred embodiment of the present invention is a process to assemble an electrical device that includes a multitude of light emitting diode (LED) dies each having respective first and second connectors that are suitable for receiving electrical current through the LED die. A common base layer is provided of a first electrically conductive material, the base layer is surmounted by an insulator, and the insulator is in turn surmounted by at least one over-layer section of a second electrically conductive material. A plurality of cavities are made that each extend through one of the over-layer sections and further through the insulator and into the base layer. At least one of the LED dies is mounted into each of the cavities with a conductive bonding material that electrically connects the second connectors of the LED dies to the first conductive material of the base layer.

And, briefly, yet another preferred embodiment of the present invention is a process to assemble an electrical device that includes a multitude of light emitting diode (LED) dies each having respective first and second connectors that are suitable for receiving electrical current through the LED die. A common base layer is provided of a first electrically conductive material, wherein the base layer has a principle side. A number of cavities are made in the principle side of the base layer. At least one of the LED dies is mounted into each of the cavities with a conductive bonding material that electrically connects the second connectors of the LED dies to the first conductive material of the base layer. An insulator is provided over the principle side of the base layer, except over the cavities. At least one over-layer section of a second electrically conductive material is provided over the principle side of the base layer, again except over the cavities. And the first connectors of the LED dies are each electrically bonded to at least one over-layer section.

These and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE SEVERAL VIEWS OF THE DRAWING(S)

The purposes and advantages of the present invention will be apparent from the following detailed description in conjunction with the appended figures of drawings in which.

In the various figures of the drawings, like references are used to denote like or similar elements or steps.

DETAILED DESCRIPTION OF THE INVENTION

A preferred embodiment of the present invention is a light emitting diode (LED) package assembly. As illustrated in the various drawings herein, and particularly in the view of FIGS. 3-10, preferred embodiments of the invention are depicted by the general reference character 100. A number of representative variations of LED package assemblies 100 in accord with the present invention are now described.

FIGS. 3a-e depict a series of stages in a process flow during manufacturer of a representative LED package assembly 100, 300 in accord with the present invention. [To differentiate from other variations of the LED package assembly 100, the variation in FIGS. 3a-e is referenced specifically as LED package assembly 300 and a similar convention is used throughout the following discussion.]

Figure 3A:
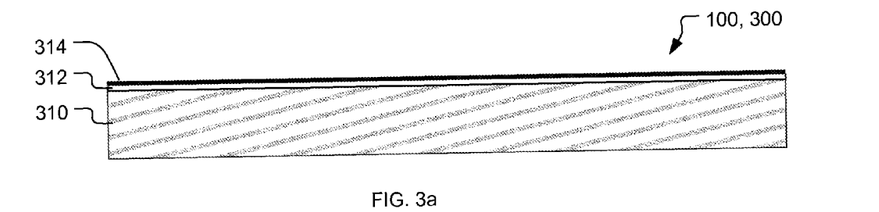
FIGS. 3a-e depict a series of stages in a process flow during manufacturer of a representative LED package assembly in accord with the present invention.

In FIG. 3a the LED package assembly 300 has a metal base 310, an insulator 312 coating on the top side of the base 310, and a continuous metal plating or foil 314 covering the top side of the insulator 312.

Figure 3B:
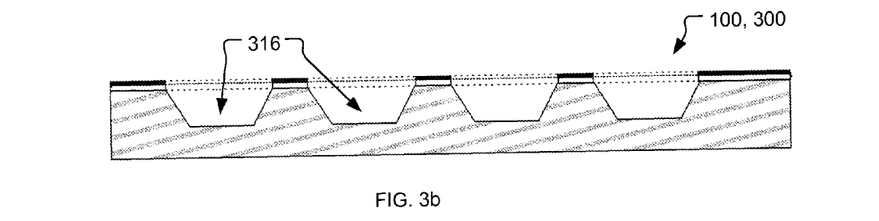

In FIG. 3b a number of cavities 316 have been provided in the top side of the LED package assembly 300, extending through the insulator 312 and the foil 314 to expose portions of the base 310. The walls of cavities 316 here are shown with an optional taper that will help reflect light from edge emitting LED devices away from the die edge and out of the completed LED package assembly 300.

Figure 3C:
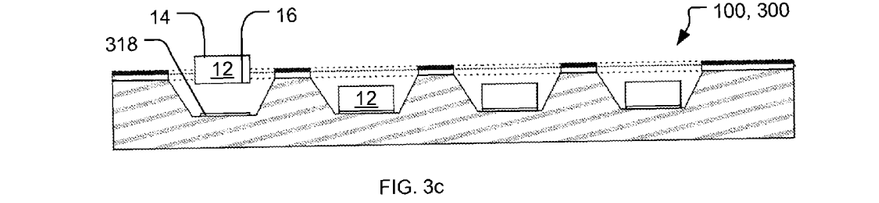

In FIG. 3c a number of LED dies 12 are shown being placed into the cavities 316. The LED dies 12 are bonded into the cavities 316 with a bonding material 318 to hold the LED dies 12 in place and to provide electrical connections between the second connector 16 of each LED die 12 and the base 310. One example for the bonding material 318 is a conductive adhesive.

Note: While edge emitting LED dies 12 are used in the examples in this description, surface emitting configurations can also be beneficially used. Additionally, while a major advantage of the LED package assembly 100 is that it can use non-solder bonding materials, but this is not a requirement. For example, solder can be used to bond LED dies 12 to lead frames at a stage before encapsulation, with lower risk of the disadvantages generally applicable to solder-based methods.

While only one LED die 12 is shown in each cavity 316 in FIGS. 3a-e, it should be appreciated that one or more enlarged cavities can be provided and that more than one LED device per cavity can also be used, including LEDs which emit different colors of the visible light spectrum which might be combined to create white light or other mixtures of colors. Similarly, while only one layer of circuits is shown, more than one layer is possible and could be used for lighting individual colors within a multiple die cavity construction. Additionally, leaving extra space in the cavities can allow for another LED to be placed into a cavity for rework or repair if the first LED fails to operate properly.

Figure 3D:
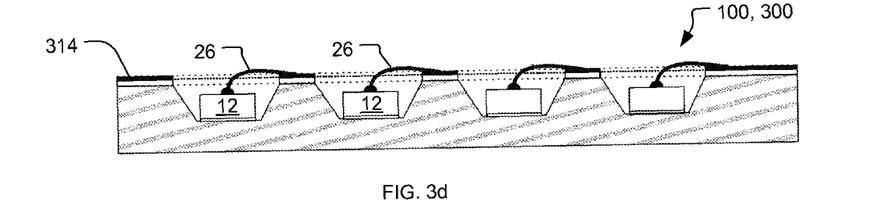
Figure 7:
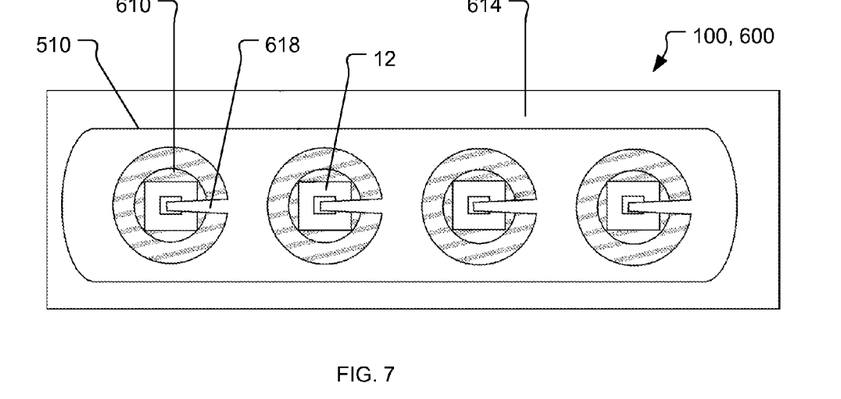
FIG. 7 is a top view of the completed LED package assembly of FIGS. 6a-e.

In FIG. 3d conductive leads 26 have been provided that connect the first connector 14 of each LED die 12 to the foil 314. Wire bonding is widely used for interconnection of semiconductor devices, but an additional option here for the conductive leads 26 is to provide integral leads or metal fingers (not shown) in the foil 314 to be down bonded using a tape automated bonding (TAB) system (such a structure is shown in FIG. 7) to make the interconnections to the LED dies 12. This can reduce the material used and the overall cost because the integral leads can be spot plated with a suitable bonding metal (e.g., gold, silver, etc.).

Figure 3E:
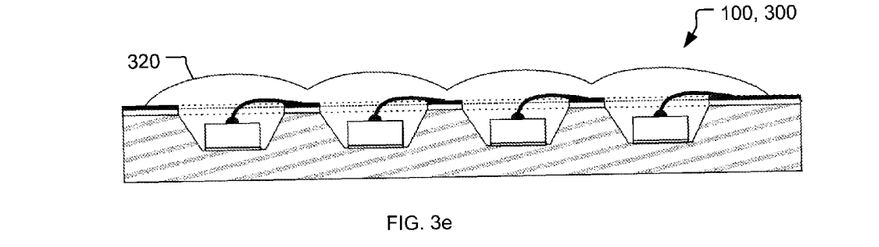

In FIG. 3e the LED dies 12 have been provided with an overcoat and/or encapsulation of a transparent or translucent cover material 320. While this cover material 320 is shown here as being contiguous, that is not a requirement and discrete portions of it can also be dispensed over each LED die 12. This would be of benefit, for example, to make flexible or foldable instances of the inventive LED package assemblies 300.

FIGS. 3a-e show the base 310 having a greater thickness than the other elements, but proportions and thicknesses here are not critical. For example, the base 310, the insulator 312, and the foil 314 (and the cover material 320, if present) can all be made relatively thin to make the final completed LED package assembly 300 flexible and/or formable.

The LED package assembly 100 can be formed into 3D shapes such as tubes or polyhedrons. Regular or custom assemblies can be created according to the needs of a customer. Moreover, individual LED package assemblies 100 can be fashioned and joined together so as to create large arrays or three dimensional assemblies (e.g., a geodesic dome comprised of interconnected lighting elements).

In case of thin embodiments, the LED package assembly 300 can also be easily processed in a roll-to-roll manner to facilitate handling and for ease of use in end-device manufacture. It is possible to improve both flexibility and utility if substantial portions of the material in the base 310 are removed between the LED dies 12 or if only minimal material is used in the base 310. The inventive LED package assembly 300 in such cases can also be bonded to a metal heat sink (not shown) to perform similarly to an embodiment having a thicker base.

Additionally, embodiments of the inventive LED package assembly 100 can be made with the LED dies 12 arranged in arrays, and there is also the potential to create a matrix having rows on one side and columns on the other that allow each LED die 12 in the array to be individually addressed and operated. This obviates the need for a second metal layer like the foil 314 here. Interestingly, such embodiments can still be constructed so that the connectors 14, 16 of the LED dies 12 can all be connected on the top side of the LED package assembly 100 if the edges are kept clear.

Figure 4:
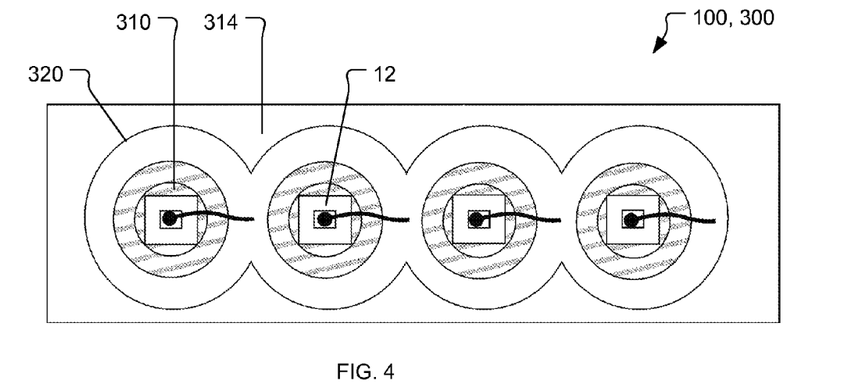
FIG. 4 is a top view of the completed LED package assembly of FIGS. 3a-e.

FIG. 4 is a top view of the completed LED package assembly 100, 300 of FIGS. 3a-e. While the LED dies 12 are shown here arranged in a regular pattern, it is possible to create instances of the LED package assembly 100, 300 in a fully custom manner for names, shapes, or other patterns.

Figure 5:
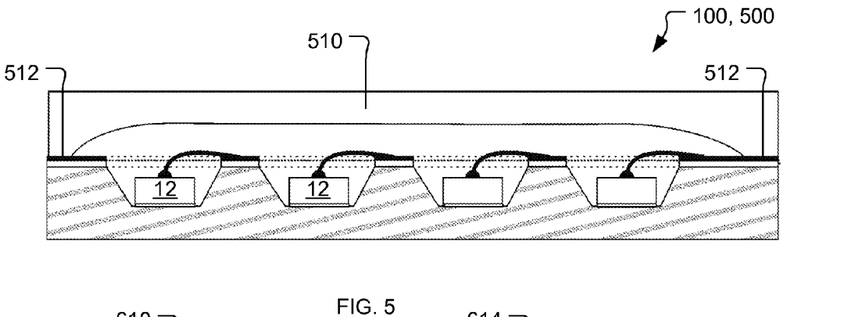
FIG. 5 is a side view of an alternate LED package assembly in accord with the present invention.

FIG. 5 is a side view of an alternate LED package assembly 100, 500 in accord with the present invention. This LED package assembly 500 may be manufactured the same as the LED package assembly 100, 300 except that the cover material 320 of FIG. 3e is instead here in FIG. 5 replaced with a transparent cover 510. The cover material 320 is desirably of a suitable material (e.g., glass) to seal edges 512 of the LED package assembly 500 to prevent the ingress to the LED dies 12 of moisture or gasses such as oxygen.

FIGS. 6a-e depict a series of stages in a process flow during manufacturer of an alternate LED package assembly 100, 600 in accord with the present invention.

Figure 6A:
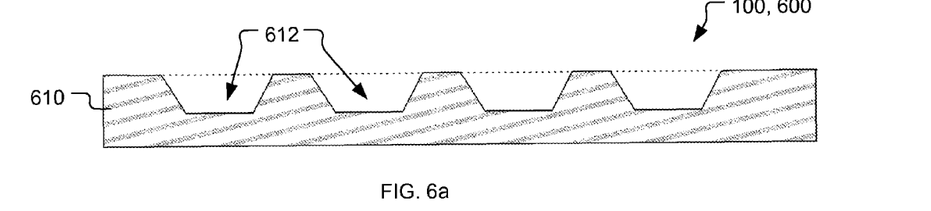
FIGS. 6a-e depict a series of stages in a process flow during manufacturer of an alternate LED package assembly in accord with the present invention.

In FIG. 6a the LED package assembly 600 has a metal base 610 in the top side of which a number of cavities 612 have been provided.

Figure 6B:
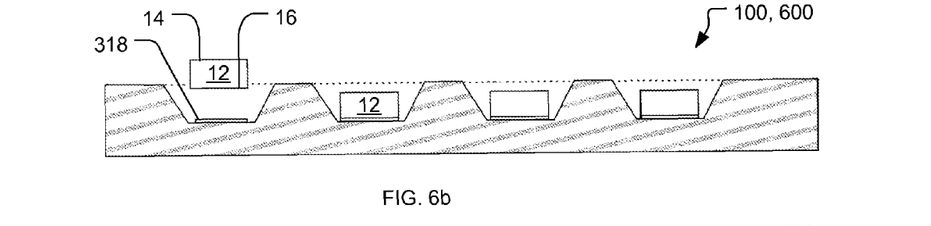

In FIG. 6b a number of LED dies 12 are shown being placed into the cavities 612. The LED dies 12 are bonded into the cavities 612 with a bonding material 318 to hold the LED dies 12 in place and to provide electrical connections between the second connector 16 of each LED die 12 and the base 610. The bonding material 318 here may be the same as that in the LED package assembly 100, 300 of FIGS. 3a-e.

Figure 6C:
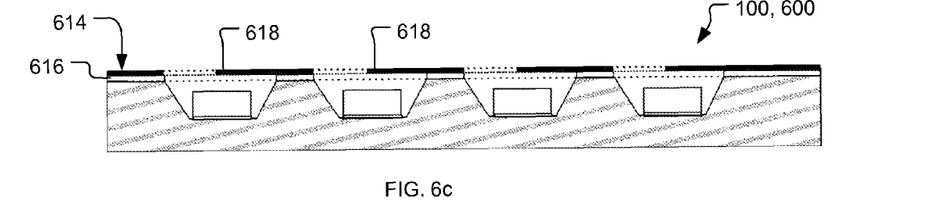

In FIG. 6c a laminate 614 has been provided on the top side that includes an insulation 616 and metal conductive leads 618 like those used for conventional TAB assembly, extending over the LED dies 12.

Figure 6D:
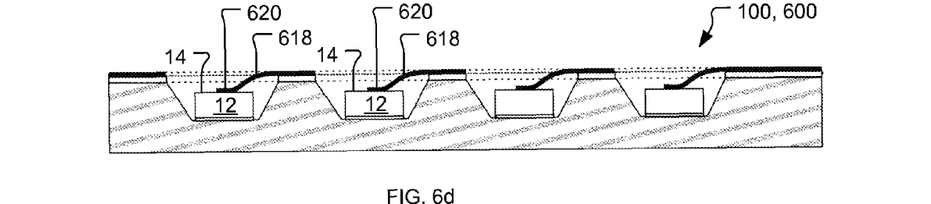

In FIG. 6d the conductive leads 618 have been interconnected to the first connectors 14 of the LED die 12 at respective bonds 620.

Figure 6E:
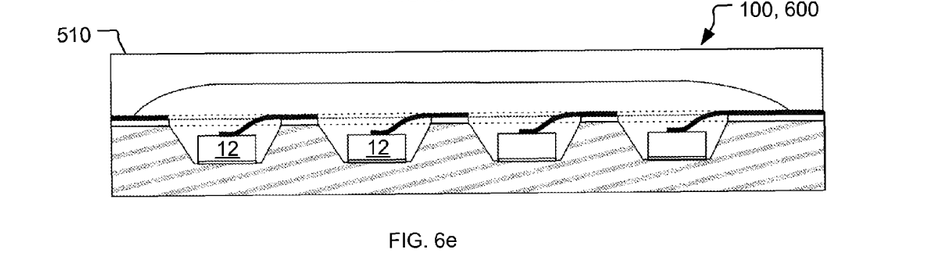

In FIG. 6e a transparent cover 510 is provided over the LED dies 12. The cover 510 here may be the same as that in the LED package assembly 100, 500 of FIG. 5. Alternately, the cover material 320 of FIG. 3e may be employed.

FIG. 7 is a top view of the completed LED package assembly 100, 500 of FIGS. 6a-e.

FIGS. 8a-e depict a series of stages in a process flow during manufacturer of a yet another representative LED package assembly 100, 800 in accord with the present invention.

Figure 8A:
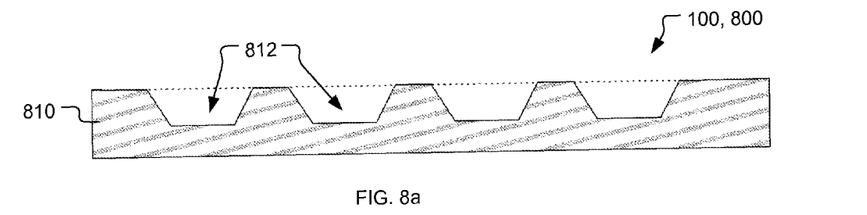
FIGS. 8a-e depict a series of stages in a process flow during manufacturer of a yet another representative LED package assembly in accord with the present invention.

In FIG. 8a the LED package assembly 800 has a metal base 810 in the top side of which a number of cavities 812 have been provided.

Figure 8B:
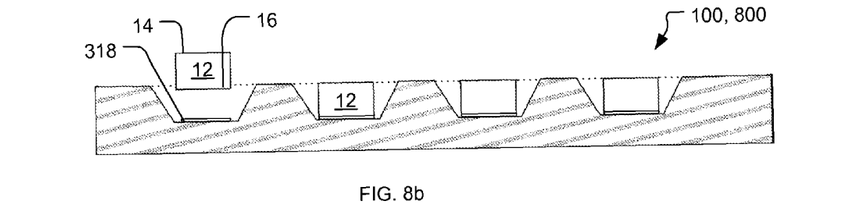

In FIG. 8b a number of LED dies 12 are shown being placed into the cavities 812. The LED dies 12 are bonded into the cavities 812 with a bonding material 318 to hold the LED dies 12 in place and to provide electrical connections between the second connector 16 of each LED die 12 and the base 810. The bonding material 318 here may be the same as that in the LED package assembly 100, 300 of FIGS. 3a-e.

Figure 8C:
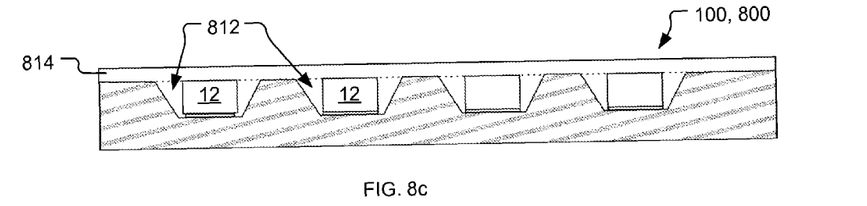

In FIG. 8c a transparent or translucent encapsulant 814 has been placed over the top of the LED package assembly 800, and thus over the LED dies 12 and the cavities 812.

Figure 8D:
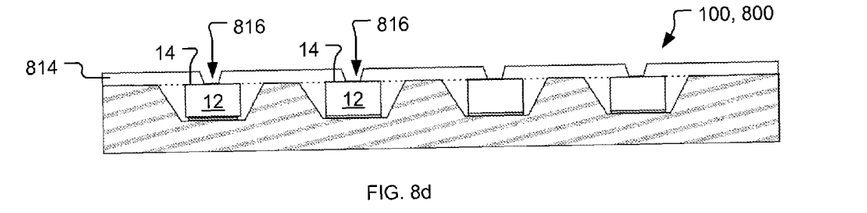

In FIG. 8d a series of apertures 816 have been created in the encapsulant 814, providing access to the first connectors 14 and the LED dies 12.

Figure 8E:
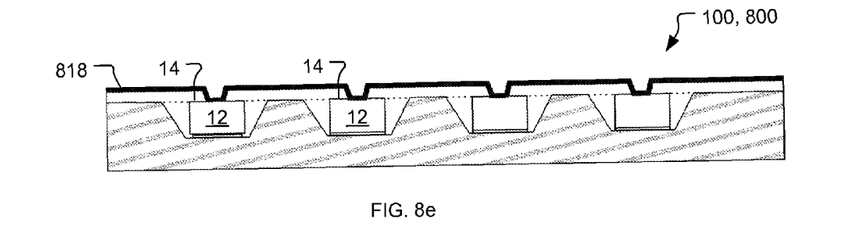

In FIG. 8e a conductive coating 818 (e.g., a metal plating) has been applied and patterned to make connections to the first connectors 14 and the LED dies 12.

Figure 9:
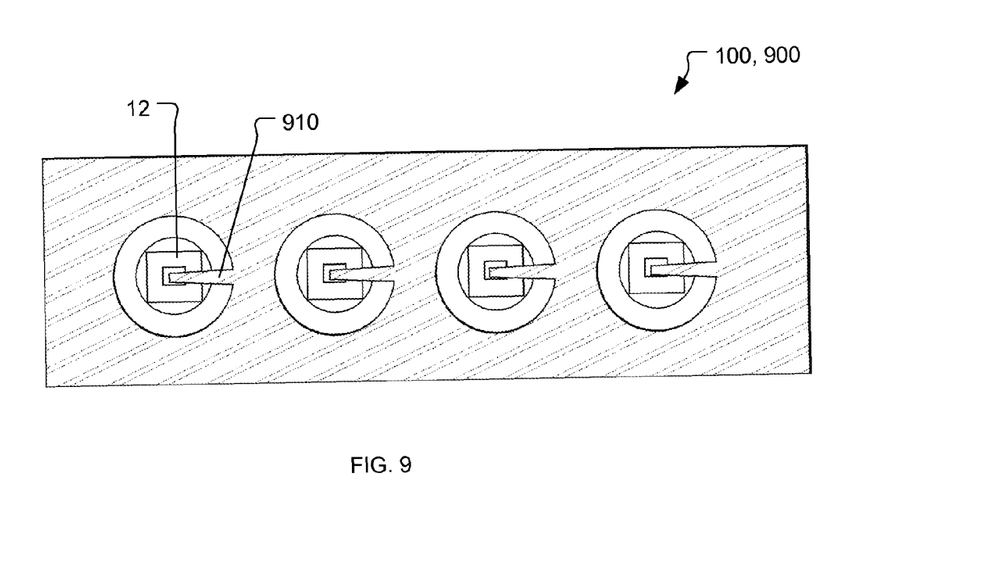
FIG. 9 is a top view of another completed LED package assembly in accord with the present invention.

FIG. 9 is a top view of another completed LED package assembly 100, 900 in accord with the present invention. The LED package assembly 900 here is made with a deposition process, similar to that which can be used to create the LED package assembly 800 in FIGS. 8a-e, only here conductive fingers 910 are provided which are similar to the conductive leads 618 in FIGS. 6a-e.

Figure 10:
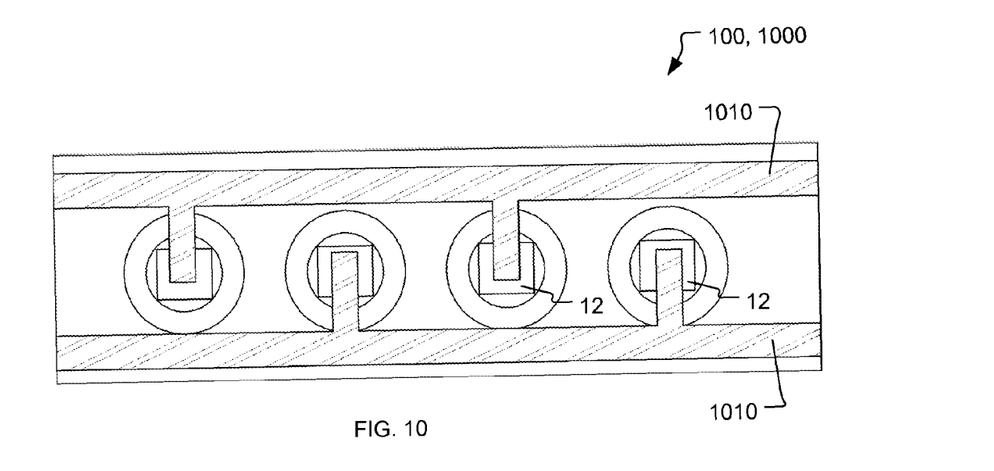
FIG. 10 is a top view of another completed LED package assembly in accord with the present invention.

FIG. 10 is a top view of another completed LED package assembly 100, 1000 in accord with the present invention. Here multiple top-side conductors 1010 are provided to the first connectors 14 and the LED dies 12. In FIG. 10 only two top-side conductors 1010 are shown, but it should be appreciated that more top-side conductors can also be provided, potentially even as many as one per LED die 12. Any of the process flow approaches described above for FIGS. 3a-e, 6a-e, or 8a-e can be extended to create the LED package assembly 1000 in FIG. 10.

Figure 11A:
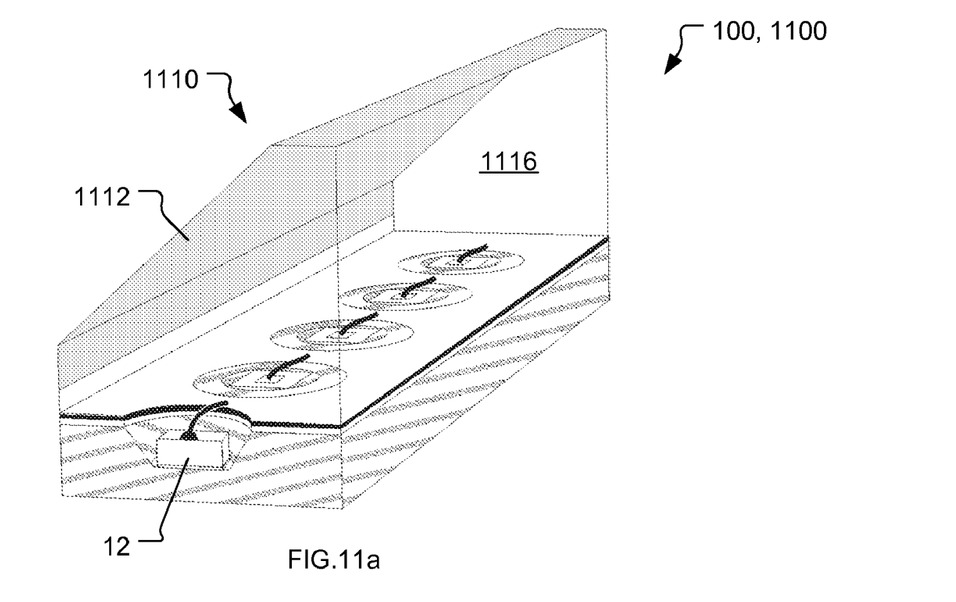
FIGS. 11a-b are partial perspective and side views, respectively, showing yet another completed LED package assembly in accord with the present invention.
Figure 11B:
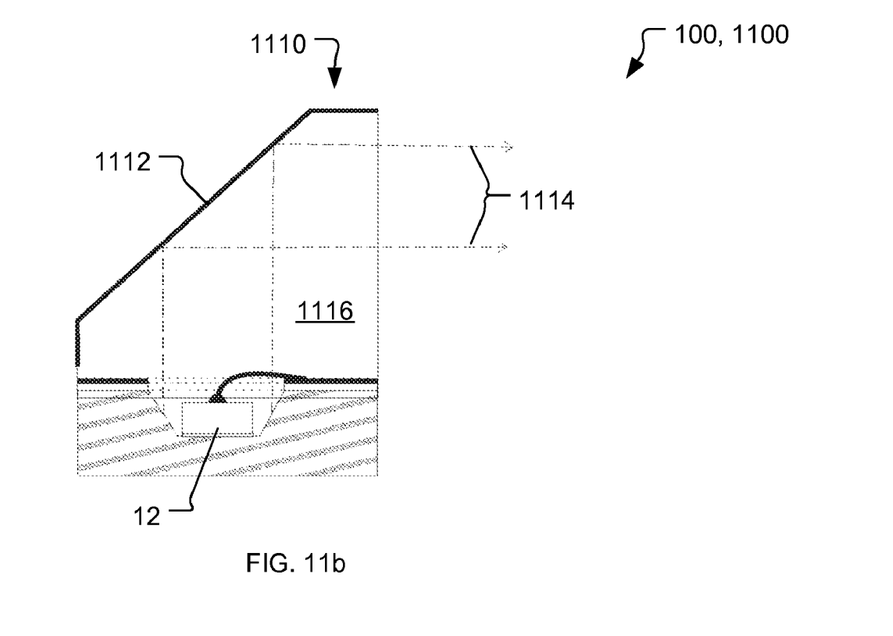

FIGS. 11a-b are partial perspective and side views, respectively, showing yet another completed LED package assembly 100, 1100 in accord with the present invention. The LED package assembly 1100 here includes a reflector 1110 having a reflective surface 1112 that is added above the LED dies 12, to receive light from the LED dies 12 and redirect it along a different light path 1114 (represented in FIG. 11b with dashed arrows). The reflector 1110 can simply be an added foil shell with open space in a region 1116 between the LED dies 12 and the reflective surface 1112. Alternately, especially when it is desirable that the LED package assembly 100, 1100 be robust and/or able to limit the ingress of corrosive gasses (e.g., oxygen) or moisture to the LED dies 12, the reflector 1110 can be made of a solid transparent material in the region 1116 with some surfaces of this solid material selectively then coated with another material (e.g., silver) that forms the reflective surface 1112. The latter case is the one depicted in FIG. 11a.

Summarizing, we have herein described a process for creating novel LED package assemblies 100 using a minimum number of process steps. The LED package assemblies 100 are produced in a manner where light emitting devices (LED dies 12) are placed and permanently affixed both electrically and mechanically (e.g., using a conductive polymer) into cavities (cavities 316, 612, 812; with at least one light emitting device per cavity) in a conductive substrate (the base 310, 610, 810; e.g., a copper or copper coated polymer). The cavities preferably have tapered walls and can optionally be coated with a light reflective coating (e.g., silver) to direct light emitted from the edges of the LED dies outward and away from the cavity and the LED package assembly. The process used creates an electrical connection between the bottom side (second connector 16) of each LED die and the base. The process used further creates another electrical connection between the top side (first connector 14) of the LED die and a metal layer (the foil 314, conductive leads 618, conductive coating 818, or conductive fingers 910).

The metal layer (the foil 314, conductive leads 618, conductive coating 818, or conductive fingers 910) is separated from the conductive substrate (the base 310, 610, 810) by an organic (e.g., resin polymer) or inorganic (e.g., ceramic material) insulating layer (the insulator 312 or insulation 616). In the latter case the LED package assembly can be created from an anodized piece of aluminum having a suitable metal plating over the top of an insulating alumina ($Al_2O_3$) skin. The insulating material may also be at least partially of a voltage switchable material, to protect the LED package assembly from electrostatic discharge.

The inventive LED package assembly 100 may optionally be coated with a transparent encapsulant or provided with an optically clear sealed cover (e.g., glass), as might be required for certain types of LEDs which operate in the UV light ranges and where a polymer coating might degrade. To protect the LED dies from degradation due to oxidation, a translucent or transparent cover can be provided that desirably creates a hermetic seal to prevent the ingress of oxygen and moisture. In either of the above cases, however, the LED package assembly can be created to leave one or more areas open to make electrical contact to the top surface metal layer. To then light the LED package assembly an electrical source is connected to this top surface contact and the bottom surface (e.g., the bottom of the base with appropriate electrical polarity and voltage to pass current through all of the LED dies).

Further modifications can be made to the basic structure of the LED package assembly 100 while staying true to the spirit of this invention. For example, the top metal layer (the foil 314, conductive leads 618, conductive coating 818, or conductive fingers 910) can, if desired, be cut, skived or milled into discrete areas so that more than one section can be made, thus creating more than one lighting circuit. Alternatively, the leads in the top metal layer can be printed directly onto the LED package assembly using conductive inks to further simplify the assembly process, if desired. The same can be done on the bottom side of the base if an insulator is applied over that surface. In the latter case a matrix then is created allowing the user to light one, a few, or all LEDs at one time.

While various embodiments have been described above, it should be understood that they have been presented by way of example only, and that the breadth and scope of the invention should not be limited by any of the above described exemplary embodiments, but should instead be defined only in accordance with the following claims and their equivalents.

What is claimed is:

1. An electrical device, comprising:
a plurality of light emitting diode (LED) dies each having respective first connectors and second connectors that are suitable for receiving electrical current through respective of said LED dies, the LED dies having a top surface, the first connector formed on a central region of said top surface;
a common base layer of a first electrically conductive material, the base layer having a flat surface, the flat surface having a plurality of cavities into which at least one of said plurality of LED dies is mounted such that said second connectors are electrically connected by a conductive bonding material to said first conductive material of said base layer;
a transparent, flat insulator layer covering said flat surface of said common base layer, the transparent, flat insulator layer further covering the top surfaces of the LED dies outside of said central regions but not filling the cavities, the transparent, flat insulator layer having apertures exposing the first connectors, wherein the transparent, flat insulator layer consists entirely of two, spaced, flat surfaces;
a patterned flat over-layer of a second electrically conductive material covering said transparent flat insulator layer and extending into said apertures, the over-layer making electrical contact with said first connectors.

2. The electrical device of claim 1, wherein:
said first electrically conductive material is also a thermally conductive material.

3. The electrical device of claim 1, wherein:
at least some of said plurality of cavities are shaped to receive light from said at least one of said plurality of LED dies mounted therein and to reflect said light out of the electrical device.

4. The electrical device of claim 1, wherein:
at least one of said plurality of cavities is shaped to mountably contain more than one of said plurality of LED dies.

5. The electrical device of claim 1, wherein:
the patterned flat over-layer comprises metal plating.

6. The electrical device of claim 1, wherein:
said base layer, said over-layer, and said insulator are collectively dimensioned thin enough that the electrical device is mechanically formable.

7. The electrical device of claim 1, further comprising:
a covering over at least said plurality of cavities of a material transparent to light emitted by said plurality of LED dies.

8. The electrical device of claim 7, wherein:
said covering extends over all of said plurality of cavities collectively.

9. The electrical device of claim 7, wherein:
said covering includes a plurality of cover sections each extending over an individual of or subsets of said plurality of cavities.

10. The electrical device of claim 1, further comprising:
a reflector to collectively receive light emitted by said plurality of LED dies and to redirect said light.

* * * * *